United States Patent
Spurell et al.

(10) Patent No.: US 6,549,091 B1
(45) Date of Patent: Apr. 15, 2003

(54) ANTENNA COUPLER

(75) Inventors: Doug Spurell, Calgary (CA); Grant Shewchuk, Calgary (CA)

(73) Assignee: Communications Systems International, Inc. (CA)

( * ) Notice: Subject to any disclaimer, the term of this patent is extended or adjusted under 35 U.S.C. 154(b) by 0 days.

(21) Appl. No.: 09/657,668

(22) Filed: Sep. 8, 2000

Related U.S. Application Data

(60) Provisional application No. 60/152,977, filed on Sep. 9, 1999.

(51) Int. Cl.$^7$ ................................................ H03H 7/38
(52) U.S. Cl. ........................................ 333/124; 333/129
(58) Field of Search ............................... 333/124, 129, 333/132; 343/204

(56) References Cited

U.S. PATENT DOCUMENTS

| | | | | |
|---|---|---|---|---|
| 3,725,942 A | * | 4/1973 | Ukmar | 343/715 |
| 3,812,494 A | | 5/1974 | Howell et al. | 343/852 |
| 4,037,177 A | * | 7/1977 | Tyrey | 333/32 |
| 4,085,405 A | | 4/1978 | Barlow | 343/858 |
| 4,095,229 A | | 6/1978 | Elliott | 343/715 |
| 4,141,016 A | * | 2/1979 | Nelson | 343/858 |
| 4,268,805 A | | 5/1981 | Tanner et al. | 333/129 |
| 4,545,059 A | | 10/1985 | Spinks, Jr. et al. | 375/133 |
| 4,706,049 A | | 11/1987 | Dydyk | 333/110 |
| 4,910,481 A | | 3/1990 | Sasaki et al. | 333/134 |
| 4,940,992 A | | 7/1990 | Nguyen et al. | 343/803 |
| 5,170,493 A | | 12/1992 | Roth | 455/82 |
| 5,258,728 A | | 11/1993 | Taniyoshi et al. | 333/132 |
| 5,386,203 A | | 1/1995 | Ishihara | 333/129 |
| 5,406,296 A | | 4/1995 | Egashira et al. | 343/715 |
| 5,548,255 A | | 8/1996 | Spielman | 333/132 |
| 5,963,180 A | | 10/1999 | Leisten | 343/895 |
| 6,256,480 B1 | * | 7/2001 | Stengel, Jr. | 455/78 |

* cited by examiner

Primary Examiner—Robert Pascal
Assistant Examiner—Joseph Chang
(74) Attorney, Agent, or Firm—Cantor Colburn LLP

(57) ABSTRACT

This invention relates broadly to rf coupling circuits enabling any platform-mounted antenna system and its associated standard broadcast-communications radio receiver, to also be used in conjunction with a navigational receiver. An exemplary embodiment of the invention is an antenna coupler for coupling a broadcast communications antenna with a broadcast communications receiver and a navigation receiver. The coupler includes independent rf paths for coupling the broadcast communications antenna to the broadcast communications receiver and to the navigation receiver.

21 Claims, 6 Drawing Sheets

ANTENNA COUPLER

CROSS-REFERENCE TO RELATED APPLICATIONS

This application claims the benefit of U.S. provisional patent application Ser. No. 60/152,977 filed Sep. 9, 1999, the entire contents of which are incorporated herein by reference.

BACKGROUND OF THE INVENTION

This invention relates to a radio-frequency (rf) antenna coupler that permits unobtrusive addition of a Low-Frequency (LF) navigational receiver capability to any platform that has an existing capability installed for receiving any standard broadcast-communications. In recent years, there has been increasing interest for fitting automobiles with GPS capabilities to assist the vehicle operator when driving in situations involving unfamiliar terrain and/or location fixing or identification in emergency scenarios. There is also an increasing demand from various fleet-vehicle companies for systems capable of asset management and vehicle tracking. With the onset of differential techniques applied to GPS usage or DGPS, the accuracy of positional determination has greatly improved and allows better real-time indication of speed, direction of travel and distance traversed. All such improvements are serving to boost interest and enthusiasm for wanting DGPS capability embedded into automobiles and other varieties of vehicular platforms. The most popular choice of DGPS implementation has been towards using radio-beacon methods because of the free access combined with a reasonable area of coverage. The most common usage has been of those systems based on the rf-band 283-kHz to 325-kHz, to utilize the networks and services provided by organizations such as the United States Coast-Guard (USCG). Hitherto the installation of such a radio-beacon receiver has dictated the mounting of a separate specialized antenna specific to the rf-band, which unfortunately proved ineffective for use with the on-board AM/FM radio receiver mounted as standard on most automobiles. Usually the antenna used was a type normally intended for marine applications, so it was invariably quite bulky. Such an additional specialized antenna not only incurred extra cost but was also perceived as being detrimental to the aesthetics of the host automobile; consequently this approach lost public appeal. The bulkiness and rather unusual profiles of these specialized antennae did not allow inconspicuous installations to be achievable.

BRIEF SUMMARY OF THE INVENTION

This invention relates broadly to rf coupling circuits enabling any platform-mounted antenna system and its associated standard broadcast-communications radio receiver, to also be used in conjunction with a navigational receiver. An exemplary embodiment of the invention is an antenna coupler for coupling a broadcast communications antenna with a broadcast communications receiver and a navigation receiver. The coupler includes independent rf paths for coupling the broadcast communications antenna to the broadcast communications receiver and the navigation receiver.

DETAILED DESCRIPTION OF THE INVENTION

The invention is directed to an antenna coupler for connecting a positional and navigational receiver to a conventional broadcast-communications antenna, so that said antenna can be simultaneously used by both a standard broadcast-communications receiver and a navigational receiver. One embodiment of the invention is an antenna coupler for coupling a conventional automobile antenna to both a DGPS radio-beacon receiver and a standard automobile AM/FM radio receiver. This approach addresses both factors of cost and public appeal. Additionally, the invention provides for covert applications for security monitoring, tracking surveillance or aiding vehicle recovery systems/networks (such as a popular system known as "Lo-Jack").

Figure 6:
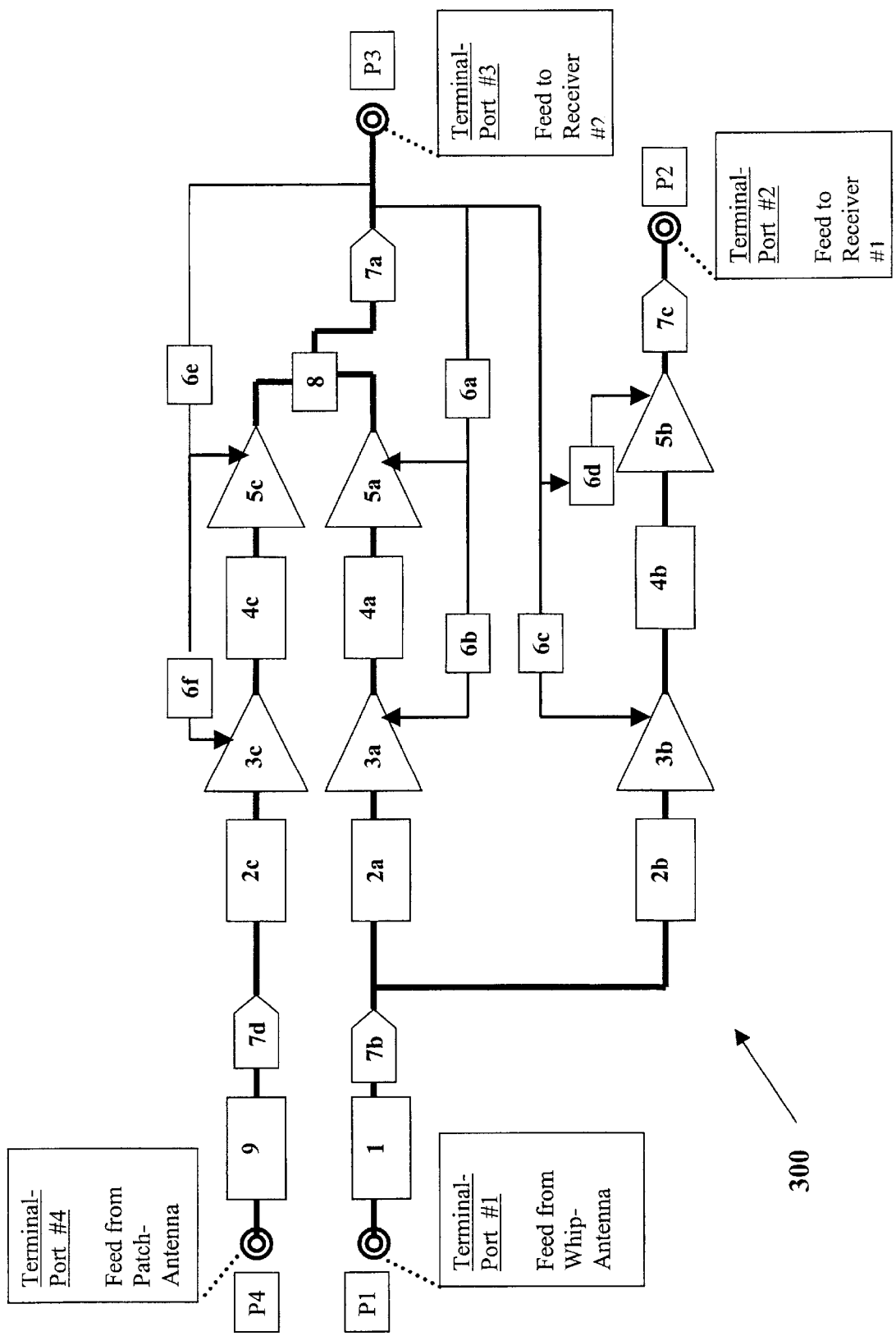
FIG. 6 is a block diagram of an antenna coupler in an exemplary embodiment of the invention.

One embodiment of the invention described herein is a three-port antenna coupler, yet the invention can be expanded to multi-port couplers to facilitate, for example, integration of a GPS receiver. One such extrapolation is for the situation where a separate GPS receiver, inter-connected to the radio-beacon receiver, might utilize the broadcast-communications antenna to obtain the necessary signals from the satellite broadcasts. By incorporating within the invention additional segregation and routing for the satellite signals, a singular broadcast-communications antenna may fulfill a tri-mode role. Another embodiment of the invention is used where a GPS satellite-receiver has been integrated together with a DGPS receiver to form a single unit. In this case, the invention would provide a fourth terminal-port for attaching a dedicated specialty antenna, with additional routing and summation to feed multiplexed signals to the integrated receiver unit. A block-diagram of such an alternate embodiment is depicted in FIG. 6.

Figure 1:
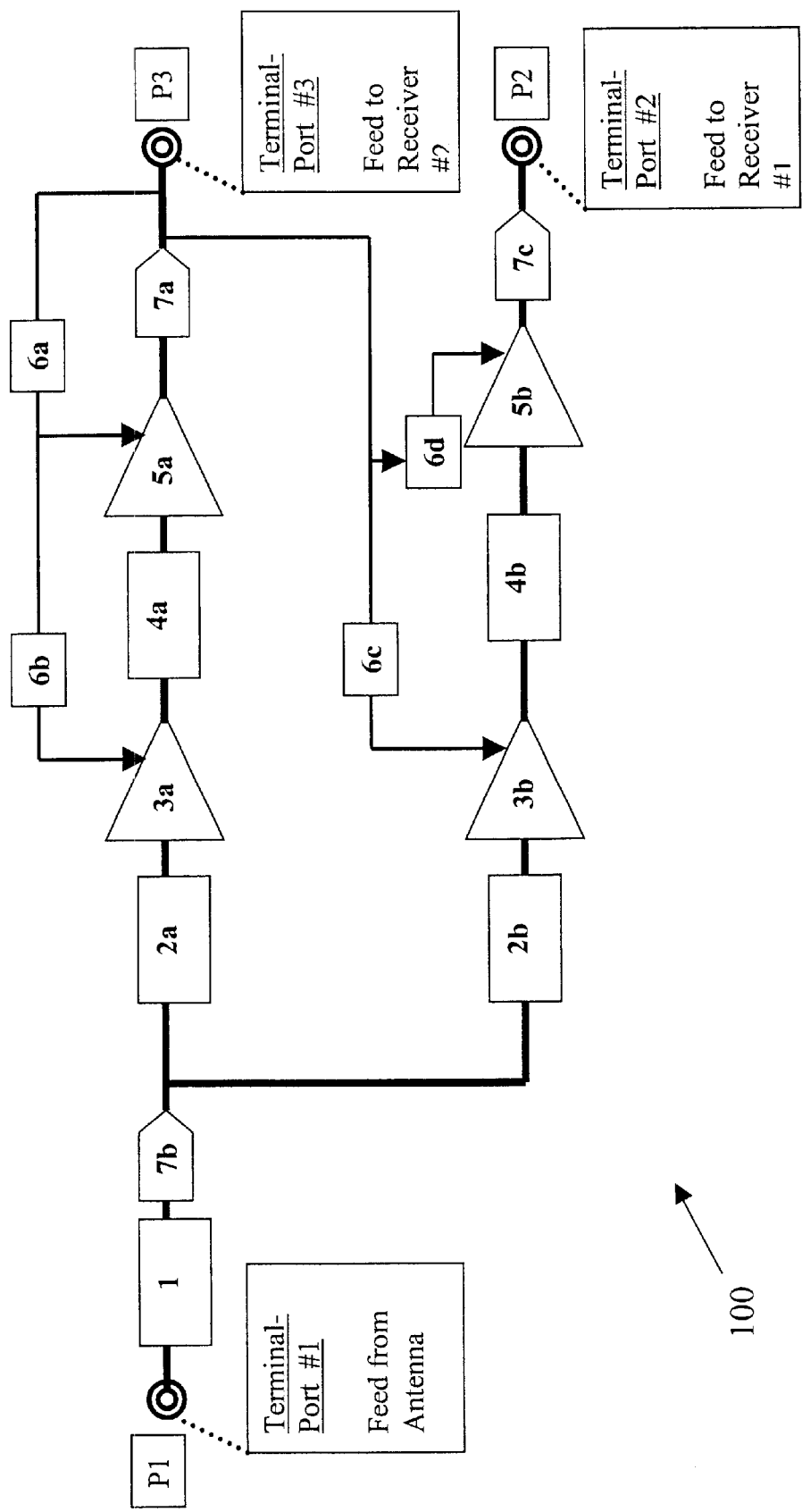
FIG. 1 is a block diagram of an antenna coupler in an exemplary embodiment of the invention.

FIG. 1 is a block diagram of an antenna coupler 100 in an exemplary embodiment of the invention. The embodiment of FIG. 1 is intended for a variety of uses and generally is used for connecting a positional and navigational receiver to a conventional broadcast-communications antenna, so that said antenna can be simultaneously used by both a standard broadcast-communications receiver and a navigational receiver. The antenna coupler 100 has an input terminal port P1 for coupling to an antenna, an output terminal port P2 for coupling to the standard broadcast-communications receiver and output terminal port P3 for coupling to a navigational receiver. A first rf path (including components 2b, 3b, 4b, 5b and 7c) interconnects the standard broadcast-communications receiver at output terminal port P2 to the broadcast-communications antenna at input terminal port P1, independently of any other connection to the coupler 100. A second rf path (including components 2a, 3a, 4a, 5a and 7a) interconnects the navigational receiver at output terminal port P3 to the conventional broadcast-communications antenna at input terminal port P1, independently of any other connection to the coupler 100.

Elements of the coupler 100 will now be described. A resonating circuit 1 is used to modify the effective electrical length of the antenna by creating a resonant circuit with the antenna and its associated lead-in cable. The values of the constituent components of the resonating circuit 1 are appropriately selected to achieve resonance of the antenna and an associated lead-in cable at a frequency central to the band of the desired navigational rf-signals. This optimizes reception of navigational signals used by the navigational receiver.

The output of resonating circuit 1 is provided to each rf path. Each rf path includes an impedance translation and isolation circuit 2a and 2b respectively, and an rf-amplifier and impedance translator 3a and 3b respectively. The rf amplifier and impedance translators 3a and 3b increase the amplitude level of the relevant received signals in the respective rf paths. The impedance translation and isolation circuits (2a and 2b, respectively in each of the independent rf-paths), provide buffering between the two rf-paths and isolate interaction between each of the receivers at terminal ports P2 and P3. The impedance translation and isolation circuit 2a provides impedance buffering between the input terminal port P1 and segregation and filtering circuit 4a. Similarly, the impedance translation and isolation circuit 2b provides impedance buffering between the input terminal port P1 and a second segregation and filtering circuit 4b.

The output of the rf amplifier and impedance translators 3a and 3b are provided to segregation and filtering circuits 4a and 4b, respectively. The segregation and filtering circuits (4a and 4b, respectively) in each of the independent rf-paths direct a chosen band or bands of signals, received from the conventional broadcast-communications antenna, to be routed respectively to each receiver at output terminal ports P2 and P3. The segregation and filtering circuit 4a selects signals for use by the navigational receiver at output terminal port P3 and the segregation and filtering circuit 4b selects signals for use by the broadcast communications receiver at output terminal port P2.

The output of the segregation and filtering circuits 4a and 4b are provided to rf amplifier and impedance translators 5a and 5b, respectively. The rf amplifiers and impedance translators 5a and 5b increase amplitude of the respective signals selected by segregation and filtering circuits 4a and 4b. Rf amplifier and impedance translator 5a increases the amplitude of the signal provided to output terminal port P3 and provides impedance buffering prior to output at output terminal port P3. Rf amplifier and impedance translator 5b increases the amplitude of the signal provided to output terminal port P2 and provides impedance buffering prior to output at output terminal port P2.

Power is provided to the rf amplifier and impedance translators 3a, 3b, 5a and 5b from a direct-current (dc) source incorporated in the navigational receiver at output terminal port P3. The dc power is provided to the rf amplifier and impedance translators 3a, 3b, 5a and 5b through dc smoothing and noise suppression circuits 6a, 6b, 6c and 6d. Additionally, the dc power is provided to the segregation and filtering circuits 4a and 4b.

A number of dc block circuits 7a, 7b and 7c are used in the coupler 100 to isolate the elements from dc voltage. The dc block circuits 7a, 7b and 7c isolate the dc power path from the rf signal paths. Additionally, the dc block circuits 7a, 7b and 7c prevent the dc power path from affecting the antenna connected to input terminal port P1, prevent any possible dc signals from the antenna from entering the rf signal paths and prevent dc power from affecting the broadcast-communications receiver at output terminal port P2.

The coupler 100 of FIG. 1 may be used in a variety of applications. One application involves connecting a standard whip-antenna (at input terminal port 1) of the type commonly mounted on a majority of automotive vehicles to a commercial AM/FM radio receiver of the type commonly mounted in a majority of automotive vehicles at output terminal port P2 and a DGPS radio-beacon receiver operating in the rf-band of about 283-kHz to about 325-kHz at output terminal port P3. As described above, the first rf-path is electrically buffered from the output terminal port P3 to provide isolation which prevents interaction between said standard broadcast-communications receiver and said selected navigational receiver. Additionally, the second rf-path is electrically buffered from said output terminal port P2 to provide isolation which prevents interaction between said selected navigational receiver and said standard broadcast-communications receiver.

Resonance circuit 1 is designed to be resonant at a nominal frequency of 300-kHz for the selected DGPS radio-beacon receiver. The segregation and filtering circuit 4b filters signals (e.g., about 550-kHz to about 1.6-MHz and about 88-MHz to about 108-MHz) from standard broadcast-communications rf-band(s) from all signals being received, to be directed along the first rf-path for use by the designated commercial AM/FM radio receiver at output terminal port P2. The segregation and filtering circuit 4a filters signals in a chosen navigational rf-band (e.g., about 283-kHz to about 325-kHz) from all signals being received, to be routed along the second rf-path for use by the designated DGPS radio-beacon receiver at output terminal port P3. The rf amplifier and impedance translator 5b provides impedance matching (nominally at 125-ohms) and signal level amplification, for a selected commercial AM/FM radio receiver at output terminal port P2. The rf amplifier and impedance translator 5a provides impedance matching (nominally at 50-ohms) and signal level amplification, for a selected DGPS radio-beacon receiver (nominally at 50-ohms) at output terminal port P3. Signals for the chosen navigational rf-band are highly attenuated in the first rf-path thereby substantially blocking passage of navigational rf-signals through to the broadcast-communications receiver at output terminal port P2. Signals for the selected broadcast-communications rf-band(s) are highly attenuated in the second rf-path thereby substantially blocking passage of signals within the rf-bands of the chosen broadcast-communications to the navigational receiver at output terminal port P3.

Figure 2:
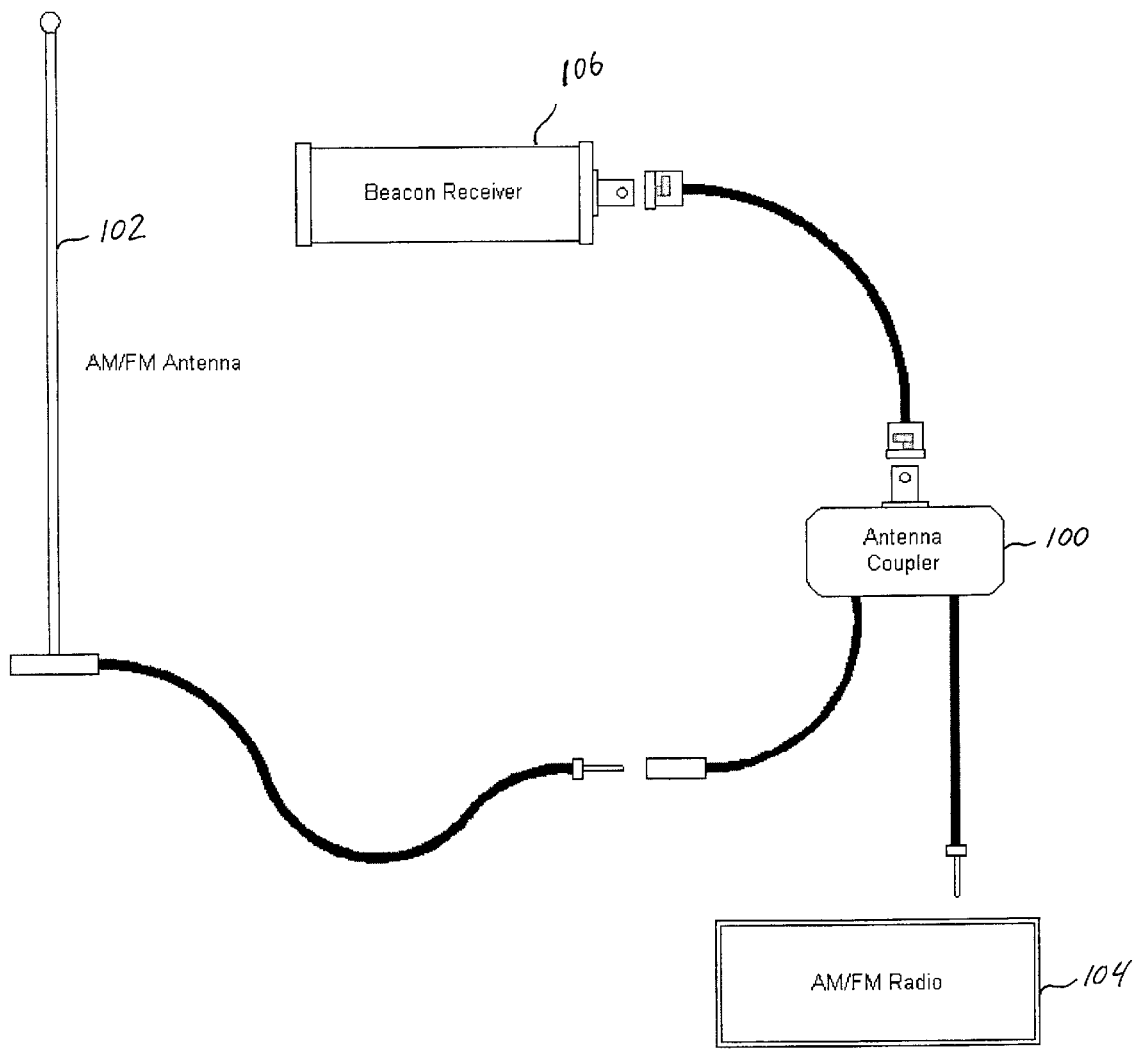
FIG. 2 depicts an exemplary application of an antenna coupler of the present invention.
Figure 3:
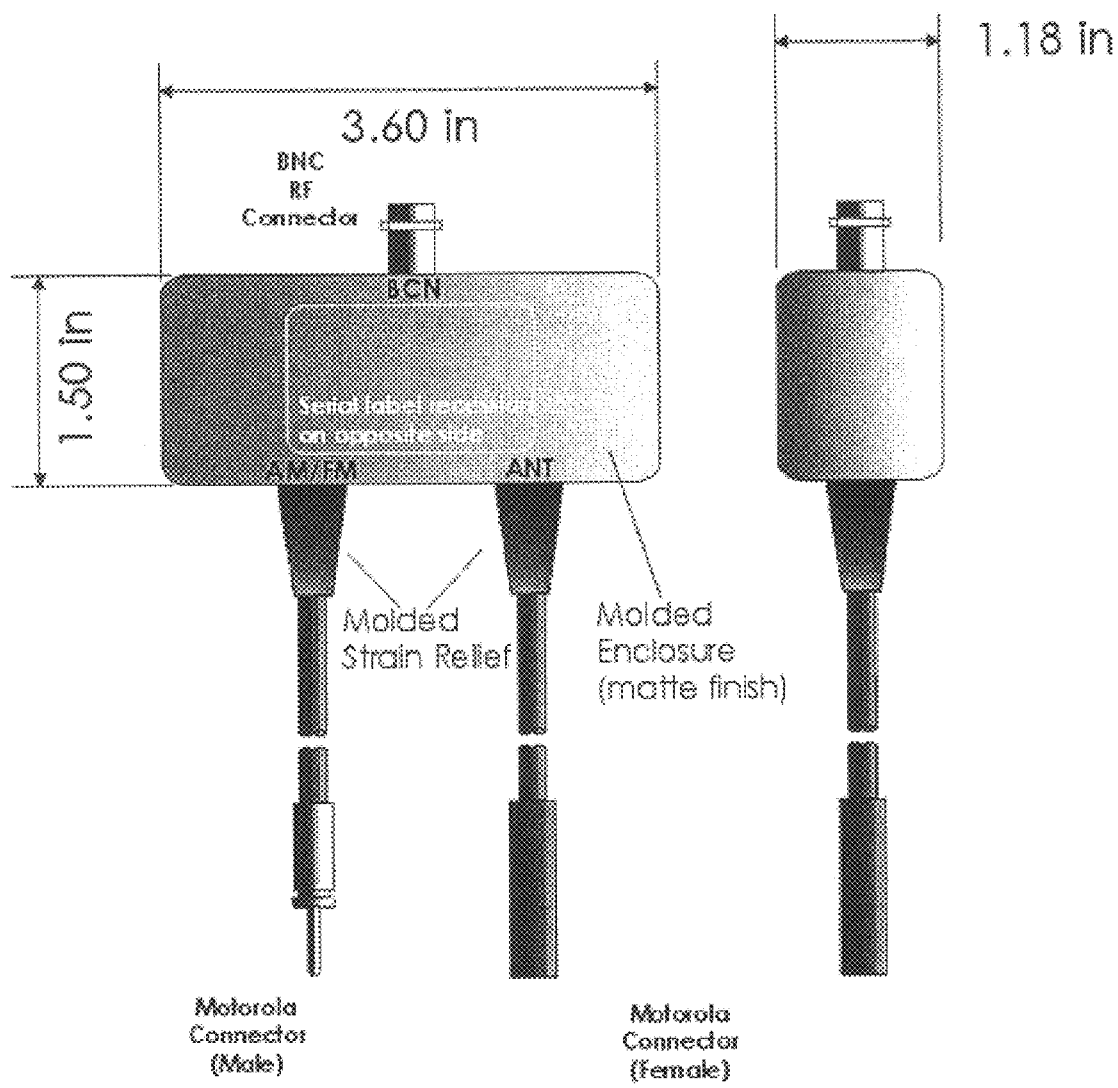
FIG. 3 depicts an exemplary physical embodiment of an antenna coupler of the present invention.

FIG. 2 depicts an exemplary application of an antenna coupler 100 in one embodiment of the present invention. As shown in FIG. 2, the antenna coupler 100 is used to couple an AM/FM whip antenna 102 to an AM/FM radio 104 and a DGPS beacon receiver 106. As described herein, the system of FIG. 2 may be provided in an automobile to eliminate the need for a bulky, specialized antenna for the DGPS beacon receiver. FIG. 3 depicts a physical-implementation of the exemplary coupler, highlighting the compactness achievable with this invention.

Figure 4:
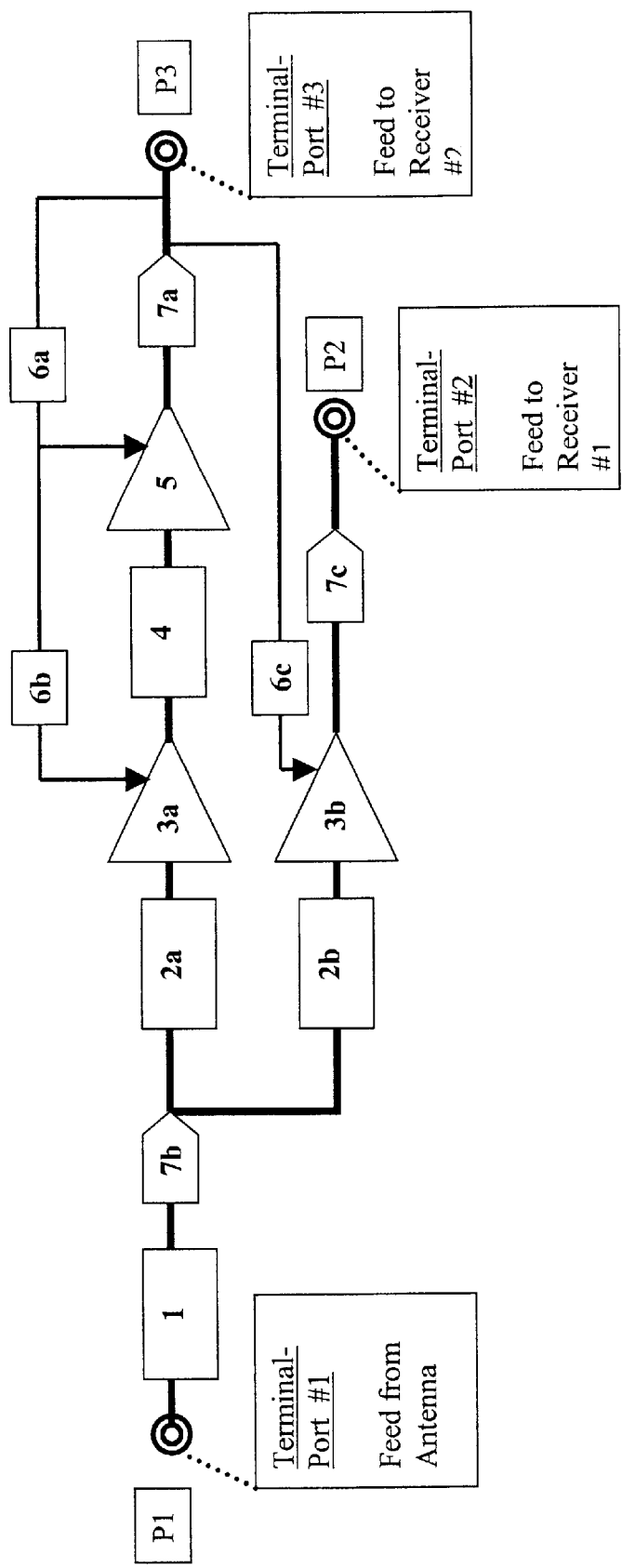
FIG. 4 is a block diagram of an antenna coupler in an exemplary embodiment of the invention.
Figure 5:
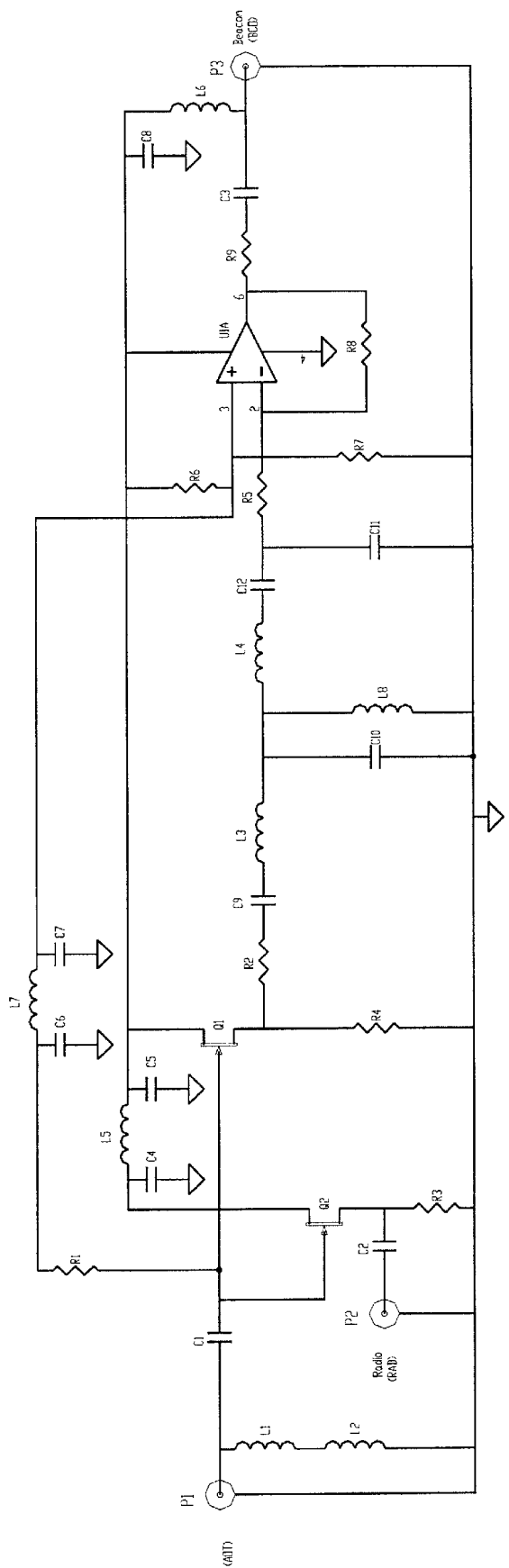
FIG. 5 is a schematic diagram for an exemplary embodiment of the invention.

FIG. 4 is a block diagram of an antenna coupler 200 in an alternate embodiment of the invention. The antenna coupler 200 is similar to that shown in FIG. 1. FIG. 5 is a schematic diagram of the antenna coupler 200. A difference between the embodiment in FIG. 4 and that in FIG. 1 is the omission of segregation and filtering circuit 4b and rf amplifier and impedance translator 5b. This additional filtering has been removed as not being critical when the receiver at output terminal port P2 is a commercial AM/FM radio. It is understood that alternate embodiments may include appropriate band-pass filtering at the frequency band(s) of the broadcast-communications receiver at output terminal port P2. Filtering may become important when the signals for the desired navigational receiver on output terminal port P3 (or harmonics thereof) fall close to (or within) the frequency spectrum being utilized by the desired broadcast-communications receiver on output terminal port P2. The necessity is accentuated because of an increase to received-signal levels in the low-frequency bands created by the resonating effects accomplished with inductors L1 and L2. Usually, high signal levels are experienced with powerful commercial AM/FM broadcasts, so the rf amplifier and impedance translator 5b is not utilized in the embodiment shown in FIG. 4. It is understood that amplification may be used in other embodiments of the invention.

The second rf path is similar to that shown in FIG. 1. In the embodiment of FIG. 4, the impedance translation and isolation circuit 2a is implemented with a field-effect transistor configured as a source-follower. The segregation and filtering circuit 4a is affected with a 'ladder-section' filter on the input to an operational-amplifier. This operational amplifier also provides output drive and matching for a DGPS radio-beacon receiver connected to the output terminal port P3.

The first stage of the coupler 200 is a resonating circuit 1, formed by inductors L1 and L2 shown in FIG. 5, to create a resonant circuit with the antenna and its associated lead-in cable. This serves to increase the effective electrical length of the automobile antenna. At a frequency of 300-kHz (the nominal center-frequency of the DGPS radio-beacon band) a standard automobile antenna, together with its associated lead-in cable, presents a predominantly capacitive impedance. Consequently, such an arrangement is normally very inefficient in reception of signals in the DGPS Radio-Beacon spectrum. The values of the inductors L1 and L2 are selected to achieve resonance with a reasonably anticipated variance of antenna and lead-in cable. Capacitor C1 functions as a blocking element to eliminate dc-current flow both to and from the antenna.

The rf amplifier and impedance translator 3b of the first rf path is a source-follower formed by a field-effect transistor Q2 and bias resistors R1 and R3. This source-follower also provides the impedance translation and isolation circuit 2b that effectively isolates the connection at the output terminal port P2 from other connections to coupler 200. In particular, this source-follower presents a low impedance to the internal circuitry of the antenna coupler, whilst presenting the desired characteristic impedance to the AM/FM radio connected to output terminal port P2. Such an arrangement prevents distribution of undesirable signals that may be generated by the AM/FM radio connected to output terminal port P2. In an exemplary embodiment, for a commercial AM/FM radio receiver, the required matching impedance is about 125 ohms. The required impedance ratio was found sufficient to provide adequate isolation in preventing undesirable signals generated by the AM/FM radio from being conducted back to either the input terminal port P1 or the output terminal port P3. Consequently, in the embodiment of FIG. 4, implementing separate means for impedance translation and for matching was considered unnecessary.

In the second rf path, the rf amplifier and impedance translator 3a is formed by a field-effect transistor Q1 and bias resistors R1, R2 and R4. This source-follower also provides impedance translation and isolation circuit 2a that effectively further isolates the connection at the output terminal-port P3 from other connections to the coupler 200. The source-follower provides input into segregation and filtering circuit 4 to segregate the required band of signals, about 283-kHz to about 325-kHz, desired for the DGPS radio-beacon receiver. The band-pass filter is implemented with a ladder-section filter including C9, L3, C10, L8, L4, C12 and C11 feeding the input of an operational-amplifier U1A. This operational amplifier also provides output-drive and matching R5, R7, R8 and R9 for a DGPS radio-beacon receiver connected to the output terminal port P3.

As shown in FIG. 4 and FIG. 5, dc supply power is obtained from the navigational receiver connected to the output terminal port P3. The embodiment in FIG. 4 provides power from the output terminal port P3 to the amplifiers through dc smoothing and noise suppression circuits 6a, 6b and 6c. These circuits include an L-section filter for providing suppression/smoothing and a further pi-section filter supplying bias to the pre-amplifier stage. An initial L-section filter L6 and C8 provides smoothing/suppression on supply to the second rf path for amplifier/driver U1A and pre-amplifier Q1. Further smoothing/suppression is provided on supply to the first rf-path, via a pi-section filter C4, L5 and C5, for the pre-amplifier Q2. Another pi-section filter C6, L7 and C7 is used to smooth/suppress the bias/reference-voltage presented to both pre-amplifiers Q1 and Q2, from the bias/reference-voltage set for amplifier/driver U1A.

To prevent unwanted dc passages, blocking elements are provided by capacitors C3, C2 and C1. Capacitor C1 functions as the block circuit 7b, capacitor C2 functions as block circuit 7c at output terminal port P2 and capacitor C3 functions as block circuit 7a at output terminal port P3.

FIG. 6 is a block diagram of a coupler 300 in an alternate embodiment of the invention. Coupler 300 includes an input terminal port P4 coupled to a singular designated conventional GPS antenna, such as a standard patch-antenna. A third rf path interconnects input terminal port P4 and output terminal port P3. The third rf path is similar to the first and second rf paths shown in FIG. 1. The third rf path includes components 2c, 3c, 4c and 5c similar to elements 2a, 3a, 4a and 5a in the second rf path. Amplifiers 3c and 5c receive power through dc smoothing and noise suppression circuits 6f and 6e. A dc block circuit 7d is also included in the third rf path.

The third rf path also includes an impedance matching circuit 9 at the fourth terminal port, to provide an interface with the GPS patch-antenna. The third rf path also includes an rf-combiner 8 to multiplex the respective signals from the second rf path and the third rf path, for output as a combined or composite signal to the output terminal port P3.

As a specific example of a practical application, reference has been made herein to an embodiment adding a Differential Global Positioning System (DGPS) radio-beacon receiver to an automobile already fitted with a commercial AM/FM radio-receiver and an associated conventional whip-antenna. However, the invention can be readily adapted for application to other platforms and/or other standard broadcast-communications receivers and/or other styles of antenna.

In contrast to other similar couplers or splitters, this subject invention provides a low-cost antenna coupler that is easy to install and offers reliability in operation. High reliability is attained with this invention by utilizing solely industry standard, commercially available component parts that do not require manual adjustments in setting up or operation for practical usage. Having achieved a high reliability, the invention can be manufactured using total encapsulation in a molded enclosure. This subsequently provides a resilient product that is reasonably impervious to numerous contaminant fluids and permits use of the invention in rather harsh environments.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the appended claims.

What is claimed is:

1. A radio frequency (rf) antenna coupler comprising:
   a first input terminal port for connection with a broadcast communications antenna;
   a first output terminal port for connection with a broadcast communications receiver; and
   a second output terminal port for connection with a navigational receiver,
   wherein said broadcast communications antenna can be simultaneously used by both said broadcast communications receiver and said navigational receiver;
   a first rf path to interconnect said input terminal port with said first output terminal port, independently of any other connection to said antenna coupler;
   a second rf-path to interconnect said input terminal port with said second output terminal port, independently of any other connection to said coupler, wherein said first path includes a first rf amplifier and impedance translator receiving a signal from said input terminal port; and
   a first dc smoothing and noise suppression circuit for receiving dc power from said second output terminal port and providing dc power to said first rf amplifier and impedance translator.

2. The radio frequency (rf) antenna coupler according to claim 1 where said navigational receiver is a differential receiver used in conjunction with a Global Positioning System (GPS) receiver.

3. The radio frequency (rf) antenna coupler according to claim 2 where said navigational receiver is a Low-Frequency (LF) Differential receiver used in conjunction with a GPS receiver.

4. The radio frequency (rf) antenna coupler according to claim 1 comprising:
   a resonating circuit positioned between said input terminal port and said first and second rf paths, said resonating circuit for tuning said broadcast communications antenna and an associated lead-in cable to modify the effective electrical-length of said conventional broadcast communications antenna to receive signals used by said navigational receiver.

5. The radio frequency (rf) antenna coupler according to claim 4 wherein:
   said resonating circuit causes said broadcast communications antenna and associated lead-in cable to be resonant at a nominal frequency of 300-kHz.

6. The radio frequency (rf) antenna coupler according to claim 4 comprising:
   a dc blocking circuit positioned between said resonating circuit and said first and second rf paths.

7. The radio frequency (rf) antenna coupler according to claim 1 comprising:
   a first dc blocking circuit positioned between said first rf amplifier and impedance translator and said first output terminal port.

8. The radio frequency (rf) antenna coupler according to claim 1 comprising:
   a first segregation and filtering circuit for selecting signals generated by said first rf amplifier and impedance translator for use by said broadcast communications receiver.

9. The radio frequency (rf) antenna coupler according to claim 8 wherein:
   said first segregation and filtering circuit selects signals in a frequency range of about 550-kHz to about 1.6-MHz and about 88-MHz to about 108-MHz.

10. The radio frequency (rf) antenna coupler according to claim 9 comprising:
    a further first rf amplifier and impedance translator receiving selected signals from said first segregation and filtering circuit and amplifying said selected signals.

11. A radio frequency (rf) antenna coupler comprising:
    a first input terminal port for connection with a broadcast communications antenna;
    a first output terminal port for connection with a broadcast communications receiver; and
    a second output terminal port for connection with a navigational receiver;
    wherein said broadcast communications antenna can be simultaneously used by both said broadcast communications receiver and said navigational receiver;
    a first rf path to interconnect said input terminal port with said first output terminal port, independently of any other connection to said antenna coupler;
    a second rf-path to interconnect said input terminal port with said second output terminal port, independently of any other connection to said coupler, wherein said second path includes a second rf amplifier and impedance translator receiving a signal from said input terminal port; and
    a second dc smoothing and noise suppression circuit for receiving dc power from said second output terminal port and providing dc power to said second rf amplifier and impedance translator.

12. The radio frequency (rf) antenna coupler according to claim 11 comprising:
    a second dc blocking circuit positioned between said second rf amplifier and impedance translator and said second output terminal port.

13. The radio frequency (rf) antenna coupler according to claim 11 comprising:
    a second segregation and filtering circuit for selecting signals generated by said second rf amplifier and impedance translator for use by said navigational receiver.

14. The radio frequency (rf) antenna coupler according to claim 13 wherein:
    said second segregation and filtering circuit selects signals in a frequency range of about 283-kHz to about 325-kHz.

15. The radio frequency (rf) antenna coupler according to claim 13 comprising:
    a further second rf amplifier and impedance translator receiving selected signals from said second segregation and filtering circuit and amplifying said selected signals.

16. A radio frequency (rf) antenna coupler comprising:
    a first input terminal port for connection with a broadcast communications antenna;
    a first output terminal port for connection with a broadcast communications receiver; and a second output terminal port for connection with a navigational receiver;

wherein said broadcast communications antenna can be simultaneously used by both said broadcast communications receiver and said navigational receiver;

- a first rf path to interconnect said input terminal port with said first output terminal port, independently of any other connection to said antenna coupler;
- a second rf-path to interconnect said input terminal port with said second output terminal port, independently of any other connection to said coupler,
- a second input terminal port for connection with a GPS antenna;
- a third rf path to interconnect said second input terminal port with said second output terminal port; and,
- a third dc smoothing and noise suppression circuit for receiving dc power from said second output terminal port and providing dc power to said third rf amplifier and impedance translator.

17. The radio frequency (rf) antenna coupler according to claim 16 comprising:

- a matching device for interconnecting the second input terminal port with said third rf path.

18. The radio frequency (rf) antenna coupler according to claim 16 comprising:

- an rf-combiner to multiplex the respective signals from the second rf-path and the third rf-path to produce multiplexed signals, said multiplexed signals being provided to said second output terminal port.

19. The radio frequency (rf) antenna coupler according to claim 16 wherein:

said third path includes a third rf amplifier and impedance translator receiving a signal from said second input terminal port.

20. The radio frequency (rf) antenna coupler according to claim 16 comprising:

- a third segregation and filtering circuit for selecting signals generated by said third rf amplifier and impedance translator for use by said navigational receiver.

21. The radio frequency (rf) antenna coupler according to claim 20 comprising:

- a further third rf amplifier and impedance translator receiving selected signals from said third segregation and filtering circuit and amplifying said selected signals.

* * * * *